United States Patent
Chou et al.

(10) Patent No.: US 7,177,220 B2
(45) Date of Patent: Feb. 13, 2007

(54) REFRESH COUNTER WITH DYNAMIC TRACKING OF PROCESS, VOLTAGE AND TEMPERATURE VARIATION FOR SEMICONDUCTOR MEMORY

(75) Inventors: Chung-Cheng Chou, HsinChu (TW); Chien-Hua Chuang, Hsinchu (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 149 days.

(21) Appl. No.: 10/841,264

(22) Filed: May 7, 2004

(65) Prior Publication Data

US 2005/0248755 A1 Nov. 10, 2005

(51) Int. Cl.
*G11C 7/00* (2006.01)

(52) U.S. Cl. .................. 365/222; 365/233; 365/149
(58) Field of Classification Search ............... 365/222, 365/233, 149
See application file for complete search history.

(56) References Cited

U.S. PATENT DOCUMENTS

| | | | |
|---|---|---|---|
| 5,278,796 A | 1/1994 | Tillinghast et al. | |
| 5,283,764 A | 2/1994 | Kim et al. | |
| 5,377,152 A | 12/1994 | Kushiyama et al. | |
| 5,751,627 A | 5/1998 | Ooishi | |
| 6,003,118 A | 12/1999 | Chen | |
| 6,404,687 B2 | 6/2002 | Yamasaki | |
| 6,483,764 B2 | 11/2002 | Chen Hsu et al. | |
| 6,597,614 B2 | 7/2003 | Nam et al. | |
| 6,603,697 B2 | 8/2003 | Janzen | |
| 6,603,698 B2 | 8/2003 | Janzen | |
| 6,707,744 B2 | 3/2004 | Jo | |
| 6,714,473 B1 * | 3/2004 | Fiscus | 365/222 |
| 6,862,239 B1 | 3/2005 | Huang et al. | |
| 6,898,140 B2 | 5/2005 | Leung et al. | |
| 6,912,150 B2 | 6/2005 | Portman et al. | |
| 2002/0000581 A1 | 1/2002 | Yamasaki | |
| 2002/0009010 A1 | 1/2002 | Hayakawa | |
| 2002/0018387 A1 | 2/2002 | Nam et al. | |
| 2003/0067827 A1 | 4/2003 | Janzen | |
| 2003/0067828 A1 | 4/2003 | Janzen | |
| 2003/0107938 A1 | 6/2003 | Jo | |

* cited by examiner

*Primary Examiner*—Huan Hoang
(74) *Attorney, Agent, or Firm*—Duane Morris LLP (57) ABSTRACT

A method and system for DRAM refresh wherein the refresh rate is proportional to the current leakage of one or more sampling cells. The sampling cells selected are representative of the nominal leakage condition of the DRAM array and track the DRAM cell leakage rates, which are dependent upon manufacturing process variations, application influences, voltage variations and the temperature of the system, both locally and globally. As the current leakage through the DRAM increases, the refresh cycle repetition frequency increases and accordingly decreases for low leakage conditions. By adjusting the refresh rate in the manner described by the invention disclosed herein, the semiconductor conserves power by reducing unnecessary refresh cycles, generates the required delay between cycles without undue power consumption and provides a cost effective means that does not require external settings and calibration to optimize the refresh rate for the variations heretofore mentioned.

21 Claims, 10 Drawing Sheets

REFRESH COUNTER WITH DYNAMIC TRACKING OF PROCESS, VOLTAGE AND TEMPERATURE VARIATION FOR SEMICONDUCTOR MEMORY

BACKGROUND

1. Field of the Invention

This invention generally relates to methods and systems to adjust the refresh rates for a semiconductor memory. More specifically, the invention relates to such methods and systems that are based on adjusting the refresh rates as a function of the cell leakage rates of the semiconductor memory.

2. Prior Art

Semiconductor memory such as dynamic random access memory or DRAM components are utilized extensively for an inexpensive solid state storage medium for digital devices such as personal computers, cellular telephones, personal data assistants and countless other products on the market today. Digital information, in the unit of one bit, resides as a single charge stored in a two dimensional array of capacitors, each having an associated transistor. Typically a one megabit memory would have 1024×1024 memory cells. A single memory cell within the 1024 can be selected by a 10-bit row address and a 10-bit column address. The memory cells, due to the charge leakage inherent in the capacitor-transistor pair, require constant refreshing, which forms the basis of the present invention.

Charges stored in the cells discharge or dissipate over time, which require that they be recharged to retain the charge levels corresponding to the value of the data they hold. There are many leakage paths for a storage capacitor such as leakage through the device's diffusion junctions and transfer gate channels dependent upon temperature, process variations (e.g., wafer to wafer fabrication, channel lengths, the threshold voltages, junction implant), and system voltage fluctuations. As temperature and voltage fluctuate during the operation of the digital device, refresh rate control can be become critical to the sound operation of the DRAM.

The circuitry for performing recharging or refresh operations can be external or internal to the memory. In an internal refresh process, both the time base and refresh row address counter are internal to the DRAM. In order to work properly, timing and refresh signals need to be provided in certain sequences and remain active during specified periods.

In U.S. Pat. No. 6,483,764 Chen Hsu, et al. teaches a method of using a DRAM refresh method and system and a method of designing a low-power leakage monitoring device. With the DRAM refresh method, the time is adjusted based on the cell leakage condition. The '764 method of designing a low-power leakage monitoring devices uses a memory cell identical to the cells in the memory array. The monitor cell is designed so that it will represent the average cell or the worst cell leakage condition. If the leakage is severe, the refresh cycle time is significantly reduced, or halved. If the leakage level is very low or undetectable, then the refresh cycle time is significantly increased, or doubled. If the leakage is moderate, or in the normal range, the refresh time is optimized, so that the power consumption used for DRAM refresh is minimized. The system is step-wise variable, whereby the refresh rate increases or decreases occurs in fixed steps. Neither the '764 method nor the corresponding system teaches the use of a sensing circuit that provides a continuously variable refresh rate by essentially tracking the influences of process, temperature and voltage variations on the memory cell leakage condition.

SUMMARY OF THE INVENTION

A method and system for semiconductor memory refresh, wherein the time is continuously adjusted based upon the leakage condition of one or more representative supervising or monitoring cells, eliminating the requirement for clock counters and associated decision making logic. These monitoring cells are designed so that they represent the average cell or the worst cell leakage condition of the DRAM array of capacitive memory cells. The refresh cycle is made continuously proportional to the cell leakage rate. The cell leakage is largely dependent upon the process variations during the manufacture of the DRAM, and operating voltage variations and temperature of the system, both locally and globally. If the leakage is high, the refresh cycle period is reduced or pulse repetition frequency is increased and accordingly, if the leakage is low the period is increased or the pulse repetition frequency is decreased.

More specifically the invention discloses a DRAM device having a self refresh mode comprising: a reference voltage; one or more memory cells having operating characteristics drawn from memory cells utilized in the semiconductor memory; one or more transfer gates, each associated with one each memory cell, having operating characteristics drawn from transfer gates utilized in the semiconductor memory to provide a current proportional to a leakage of charge from one memory cell and its associated transfer gate; a comparator that changes state when the voltage across the memory cell due to the leakage of charge is equal to the reference voltage; a pulse forming means responsive to a change in state of the comparator, such that it generates a pulse, whereby the pulse serves to produce a continuously variable refresh rate and further provides an input to a switching gate to reset the monitoring leakage cycle.

BRIEF DESCRIPTION OF THE DRAWINGS

The invention is best understood from the following detailed description when read in connection with the accompanying drawing. The various features of the drawings are not to scale. On the contrary, the dimensions of the various features may arbitrarily be expanded or reduced for clarity. Included in the drawing are the following figures.

DETAILED DESCRIPTION OF THE INVENTION

Figure 1:
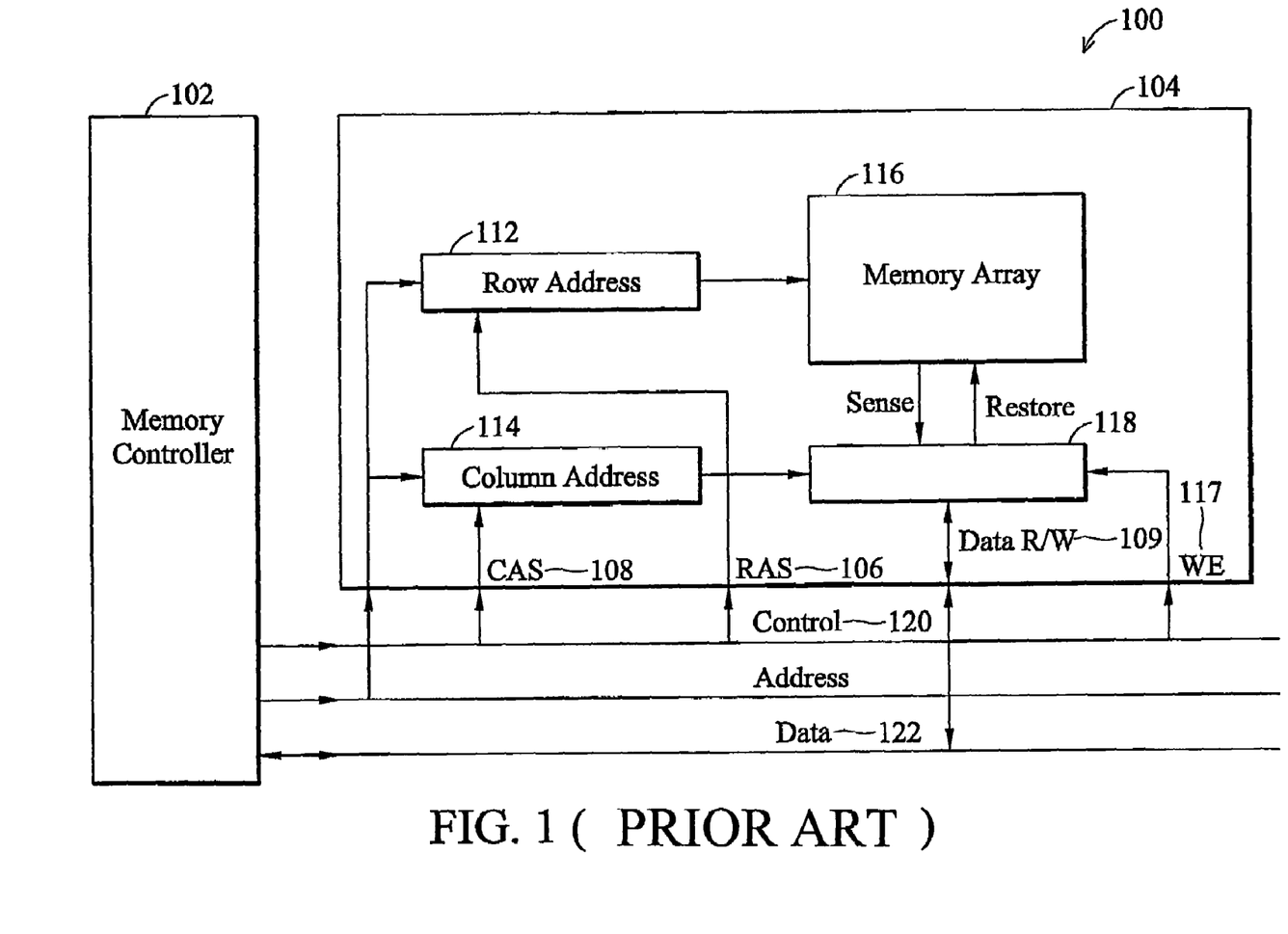
FIG. 1 is a block diagram of a prior art internal structure of a DRAM.

A DRAM 104 shown in FIG. 1 is an assemblage of mechanisms that serve to provide data storage, and control over how and where the data is stored as well as status indicators. By way of example, the DRAM has multiplexed address lines and separate data inputs and outputs that function in accordance with control signals provided by a memory controller 102. The three most common control signals are: RAS 106 (row address strobe), CAS 108 (column address strobe), and WE 110 (write enable). Access to a content in memory array 116 is through selection of the row addresses 112 and columns addresses 114 that represent physical memory addresses. To access a memory array 116 location, the row address 112 is generated within the memory controller 102 and held in a latching circuit (unshown). This address selects one of a series of rows referred to as word lines in a memory array 116. Non selected word lines are deactivated. To write into the memory array 116, the contents of a column read write buffer, logic and amplifier 118 are restored to a row of capacitors within the memory array 116 through a selected row of transistors (unshown). In the case of a read operation, the contents of the row of capacitors are sent through the selected row of transistors and data lines to the read write logic and amplifiers 118.

The process for accessing a data element is as follows: A number of control signals 120 initially all being inactive (typically a logic high), a memory cycle is started with a row address 112 applied to an address input of a memory array 116 on a falling edge of RAS the buffer 118. With RAS 112 active, the column address 114 is applied to address pins and CAS 108 becomes active selecting the desired bit or bits in the row which will appear at a data output bus 122. By additionally activating WE 110, the data applied to the inputs can be written into a selected location into the buffer 118. Deactivating CAS 114 disables the data input and output. Deactivating RAS 106 causes the data in the buffer to be written back into the memory array 116.

A wide variety of different types of DRAM exist depending on the digital device in which they will find their application. However, DRAM technology has in common certain features such as the storage mechanism and the requirement for refreshing the memory cells on a regular basis. As indicated, to access a memory cell within the memory array 116, one entire row of cells is selected and its data contents are transferred into the buffer 118. Reading the cell discharges the storage capacitor that comprises the bit cell. The bits that are read or written in the buffer are then written back into the selected row, thereby refreshing the read bits essentially recharging the storage capacitors in the row. Whether a storage capacitor is refreshed in this manner or not, all bit cells in the memory are refreshed periodically thereby preventing data from dissipating. DRAM refresh rates are typically at least every 15.625 milliseconds. They differ in the way they are interfaced to the system, however, the structure of the memory cell itself is essentially the same over the wide variety of DRAM types.

For volatile memories, since data cannot persist indefinitely, data refresh is mandated. A regular clock is used to trigger the refresh operation residing in the memory controller 102. The cycle time of the clock depends on the data retention time. The particular memory device and operating parameters determine the data retention time.

A number of different refresh modes are currently found in DRAM memory devices. For example, one scheme, referred to as "RAS only refresh" is used to refresh a row via a normal read access without asserting the CAS 108 signal. Alternatively, "CAS before RAS refresh" is incorporated in devices that have a built-in counter for the refresh row addresses. By activating "CAS before activating RAS" this counter is selected to supply the row address instead of the address inputs. Finally, "Self-Refresh" is a memory scheme that generates refresh cycles internally. No external control signal transitions, except those required for the "Self-Refresh" mode, are required to maintain the data resident in memory.

Figure 2A:
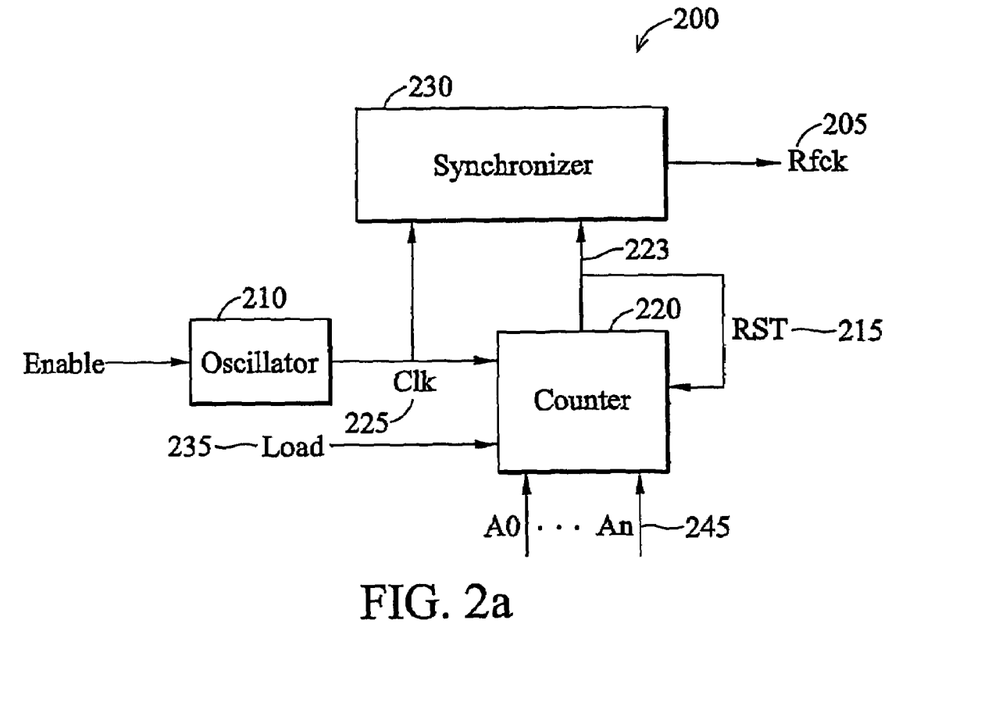
FIG. 2a is a schematic diagram of a prior art conventional refresh counter.

FIG. 2*a* depicts the conventional prior art circuit configuration utilized to generate the refresh clock 205. A system clock 225 or internal clock is generated from the output of an oscillator 250 depicted in FIG. 2*b*. The clock 225 provides pulses that trigger a digital counter 220. A pre-set count number is latched by signal "load". By way of example, if the preset number is 32, then every 32 clock (system clock or internal clock) cycles one refresh cycle will be performed and one row or word line will be refreshed. For a memory of one thousand-twenty four by thirty-two bit words (referred commonly as a 1024 word memory), each word line would be refreshed after 1024 times 32 clock cycles. If one clock cycle 5 nanoseconds (ns) the data retention time must be greater than the retention charge occurring during a 5 ns cycle multiplied by 1024 multiplied by 32, which equals 164 micro-seconds (µs). For the 15 milliseconds (ms) retention time case, the preset number may be in the range of 2000 to 3000 times this FIG. The pre-set number will be determined after data retention time test and thereafter fixed by program means well known by those in the art of manufacturing DRAM devices.

The counter 220 will count either down or up depending on the system design, until a pre-set count 223 has been reached. Upon reaching pre-set count 223 a signal RST 215 resets the counter 223 and through the operation of a synchronizer 230 initiates a synchronizing pulse 205.

Since an internal clock, such as by way of example, a clock generated from a free running ring oscillator cannot be anticipated to be synchronous to the system clock. A synchronizer 205 is necessary to make sure each refresh cycle is performed at the same timing of each system clock. Furthermore, the counter 220 must be programmable for different system's refresh counter or internal clock.

Figure 2B:
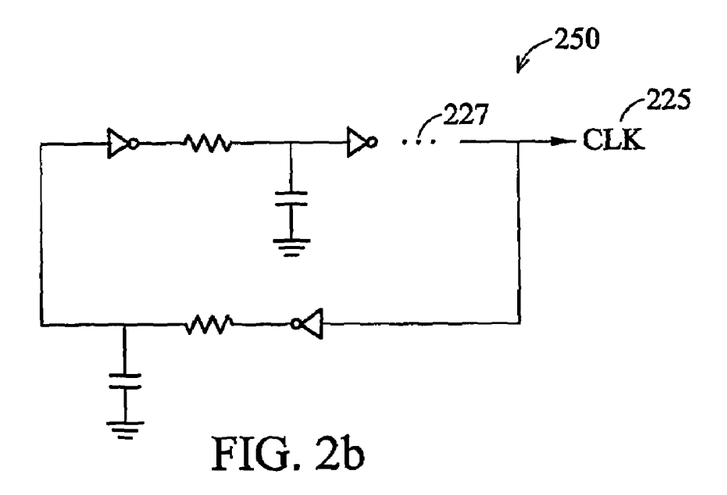
FIG. 2b is a schematic diagram of a prior art oscillator utilized to generate a counter clock.

An internal clock can generate a fixed pulse 205, regardless of the operation frequency. FIG. 2*b* illustrates a delay chain 227 that generates a small time delay in the order of for each inverter is typically on the order of pico-seconds ($10^{-2}$ seconds). Often a resistor and capacitor pair is utilized to increase time delay through the chain. To generate a micro-seconds ($10^{-6}$ seconds) magnitude of delay, typically requires hundreds of inverter stages requiring large layout space requirements for both the inverters and associated delay resistors and capacitor counter or internal clock.

A typical ring oscillator with RC delay and counter consumes relatively large amounts of space. The present invention utilizes an off-state current source constructed, utilizing hundred (100) transfer gates having a width/length=0.2/0.13 microns, typically can be lumped together as one single large transistor having a width/length=20/0.13 microns, and an associated capacitor with several femto-Farads capacitance. A simplest operational amplifier may require as few as five transistors.

For many DRAM devices, the data retention time is in the milliseconds order of magnitude, 15 milliseconds being a typical standard. If, by way of example, we assume a retention time of 15 ms and a 5 ns clock cycle operating in a typical worst case high temperature device environment (85° C. to 110° C.). In this temperature range, the refresh requirement for one word line in each would be approximately 3,000 clock cycles [(15 ms/1 k/5 ns) or 15μ(15 ms/1 k)]. If we assume the same operating parameters in a 25° C. device environment, the refresh requirement reduces to 30,000 clock cycle or 150μs to complete a refresh operation. Utilizing a fixed frequency conventional counter, as indicated by the prior art, so as to accommodate the high temperature potential conditions, tends to "over drive" the DRAM in the low temperature case. In the present invention the refresh frequency tracks temperature change as a function of the temperature sensitive properties of the semiconductor.

Since delays in the order of micro seconds are needed for each refresh, many hundreds of stages of a delay chain are often required to satisfy the refresh requirement. Such a proliferation of delay chains requires a large layout space, consuming considerable power because each increment of delay is produced by a separate logic gate. These types of delay mechanisms cannot adjust to the various cell data retention times resulting from process variations, such as temperature fluctuations and bias disturbances. However, as will become apparent from the present invention, such delay chains will be made unnecessary.

Figure 3A:
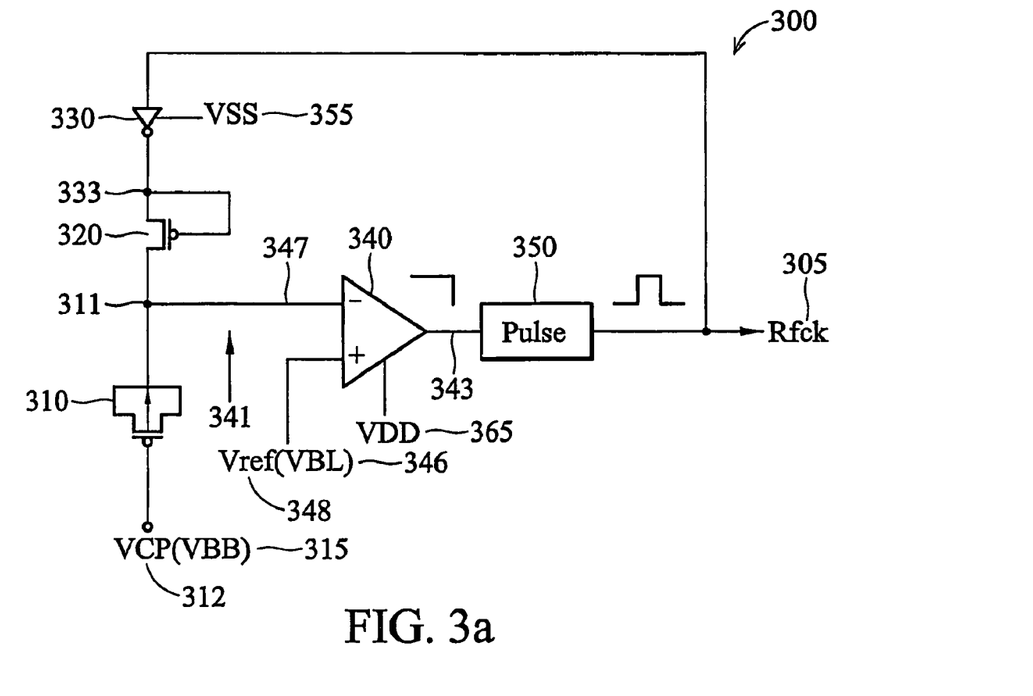
FIG. 3a is a schematic diagram of the invention utilized to generate a refresh clock.
Figure 3B:
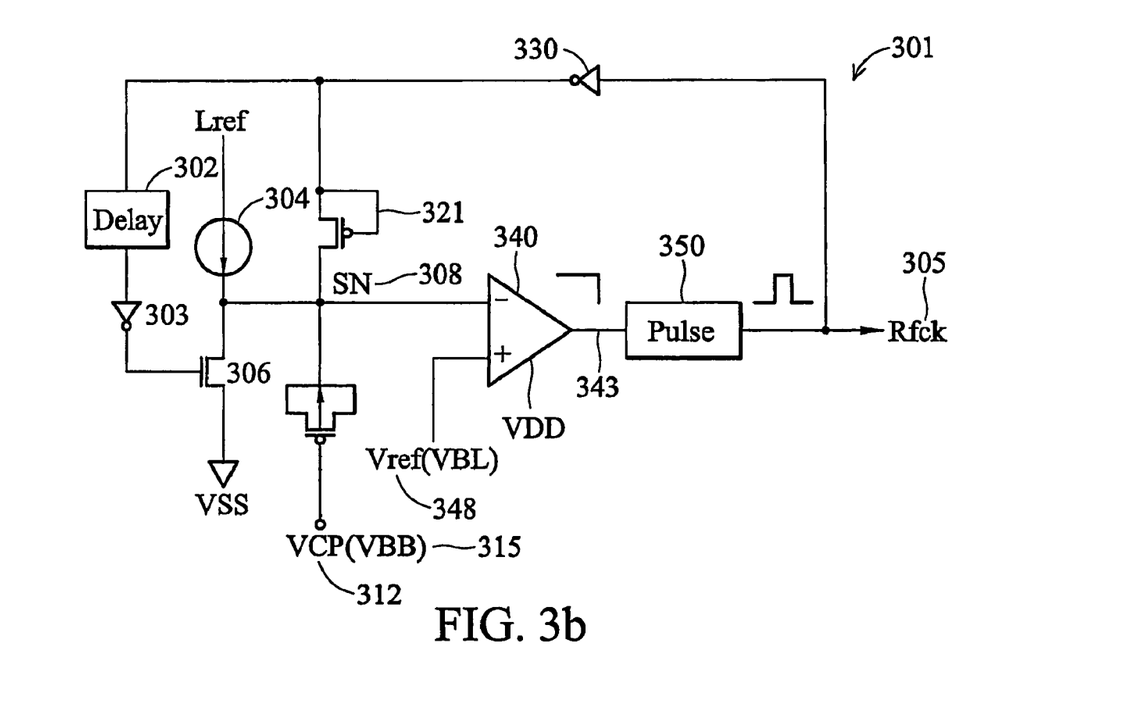
FIG. 3b is a schematic diagram of the invention utilized to generate a refresh clock.

The present invention illustrated in FIG. 3 utilizes one or more means for storing charge as represented by one or more cell capacitors 310, whereby the associated leakage current that discharges and dissipates the stored charge generates a sufficient long delay, so as to track the process, voltage and temperature variations inherent in devices employing DRAM.

FIG. 3a describes a preferred embodiment of the present invention wherein a transfer gate array 320 represents a number, N, of transfer gates, through which flows a statistically representative leakage current for the DRAM. The average over the large number of leakage current sources produced by the pairs of transfer gates 320 and cell capacitors 310, forms a statistically stable charge dissipater and retainer or holder of charge. Essentially, the circuit as illustrated in FIG. 3a uses off state sub threshold currents and junction leakage currents as a current source to charge the capacitor 310. The charge time produces a charging delay that tracks the data retention time.

Since the cell capacitors 310 forming the array are constructed from the cell technology utilized in the manufacturing of the DRAM memory arrays, the cell capacitors 310 are subject to the same process, voltage and temperature variations and thereby any effect upon the DRAM memory elements are reflected in the N transfer gates 320 to thereby track the variations related to DRAM array 116 cells. Additionally, cell 310 may connect to a separate reference potential VCP 312. Potential voltage VCP 312 typically is associated with VBB 315, an internal voltage for DRAM operation, and thereby any voltage variations in VBB 315 influence the potential VCP 312.

It must be noted that the invention does not require N cell transfer gates and associated N cell capacitors in the same proportion as the number of corresponding cells in the DRAM cell array. The number N will depends on the current source requirements. Note, however, that the current source resulting from the hundreds or thousands of transfer gates can be lumped into tens of larger (typically wider) semiconductor devices.

For example, if it is desired to generate a 6 μs delay to refresh one word line, (not equal to retention time) then by way of example, the designer of the DRAM might employ a 10 fF capacitor implemented utilizing a pmos capacitor with a width/length 1.2 μ/1.2 μor by lumping three or four cell capacitors. Furthermore, for a drain voltage VDD equal to 0.2 1.2V and Vref 348 equal to 0.6V, then a 1 nA current source would be required.

The requirements are estimated by following formula, utilizing the relationships between charge, voltage current and time:

$$Q=CV \text{ and } I=Q/T.$$

Then, through substitution the values in the example:

$$I=(1.2V-0.6V)*10 \, fF/6.0 \, \mu s$$

$$I=1.0 \, nA$$

Where:
Q denotes charge transferred during the charge interval,
denotes the capacitance,
V is the voltage change during the charge interval,
I denotes the required current source,
T is the delay time interval.

If the off current for one transistor having a width/length 20/0.13 is 0.1 nA, then an array of ten (10) transfer gates of width/length 20/0.13 in parallel would be required to satisfy the current requirement of 1.0 nA in the above example.

The self refresh mode comprises a first potential generation means 306 for supplying a reference potential and a second potential generation means 307 for supplying a reference charge to a cell 312, which represents a means for storing charge, typically one or more capacitor memory cells having operating characteristics drawn from the memory cells utilized in the manufacture of the semiconductor memory 104; and one or more transfer gates as illustrated by transfer gate 320, each said transfer gate 320 associated with one each cell 312, to provide a current proportional to the leakage of charge 341 from one memory cell and an associated transfer gate 320; a first switching means 340 responsive to a voltage proportional to the leakage currents for selectively providing an output 343, when the leakage of the charge 341 produces a voltage equal to or less than the referenced potential 306; which is thereby used as an input to a pulse forming network means 350 responsive to the change in a state 343 of the first switching means 340 such that it generates a pulse 305, also referred to as the refresh clock 305.

Referring to FIG. 3a, if the initial condition of a node 311 is at a source voltage VSS 355, where VSS 355 is at ground level and the transfer gate 320 (or N-transistor array) is at cut off, since node 333 is at the drain VDD potential. Under this condition the transfer gate 320 functions as a nano ampere current source, that charges a capacitor 310. The node 311 voltage level rises due to the charging of the capacitor 310. Until node 311 reaches the potential of Vref 348, an output 343 of the comparator 340 will remain high at the VDD 365 potential. The state of the refresh clock 305 remains low and 333 remains high due to the inversion provided for by inverter 330.

When node 311 potential reaches the potential of Vref 348 (typically in the order of magnitude measured in microseconds) due to charging capacitor 310, the output 343 of the comparator 340 goes low. The trailing or falling edge of the output 343 triggers a pulse generator a refresh cycle that includes, in significant part, enabling a one word line, whereby all cells are refreshed. The positive pulse 350 also turns transfer gate 320 to an "on" state, whereby the node 333 reaches potential VSS 355. Transfer gate 320 acts as a diode with a |VTP| (approximately 0.35V for 0.13 μm generation) voltage drop between node 311 and node 333, whereby capacitor 311 discharges, from Vref 348 down to |VTPI (approximately 0.35V). This completes the cycle. When operating in a steady state mode, the potential on capacitor 311 will sweep the range between |VTP| and Vref 348.

VCP 312 is a voltage supply typically connected to VBB 315 which is an internal supply voltage for DRAM power. VBB 315 is used to bias capacitor 310 in the inversion region and serves to replicate the bias condition for the DRAM 116 cells. Thus, the refresh delay that results from capacitor 311 charging from |VTP| to Vref 348 tracks VCP 312 or simply VBB 315 variations.

A pure off current or sub threshold current increases exponentially as temperature increases in the DRAM. This current may track environmental changes, but for some applications the tracking may be too aggressive. Alternatively, one embodiment of the present invention provides a greater degree of tracking stability for the refresh counter. Referring to FIG. 3b, circuit 301 operates substantially as FIG. 3a, circuit 300, except for the incorporation of a bias-independent current source 304, which functions to supply a current that is relatively insensitive to process, voltage and temperature variations. The current source 304 is used to depress a pure off current making the total temperature dependency lower than for example the circuit embodied in FIG. 3a. Delay 302 and an inverter 303 control gate 306 pulling the storage node 308 to Vss potential after every positive RFCK signal.

Figure 4:
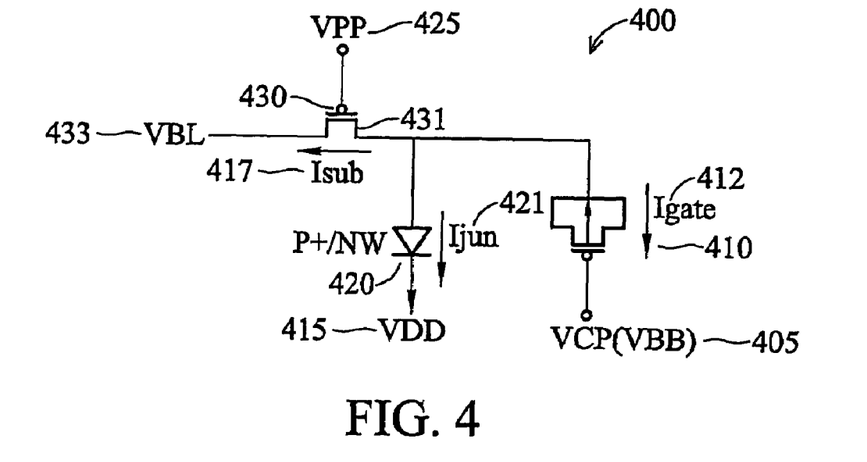
FIG. 4 is a schematic diagram of a circuit to generate a reference voltage proportional to the current leakage rate.

FIG. 4 illustrates the generation of a voltage 433 proportional to the current leakage rate; the number $N_1$, of transfer gate junctions as illustrated by transfer gate 430 multiplied by the respective charge leakages: (Isub 417+I junction 421) to which is added, $N_2$ the number of capacitor cells 410 multiplied by the respective charge leakages (Igate$_1$ 412+ Igate$_n$ 412 . . . .). A capacitor reference voltage VCP 405 supplies a reference potential to an illustrative cell 410 representing one or more memory cells, having operating characteristics drawn from the memory cells utilized in the DRAM 116. Cells 410 charges through one or more transfer gates 430, each transfer gate 430 associated with one each of the multiplicity of memory cells 410, to provide a reference voltage proportional to the leakage of charge from the cells 410. If current Igate 412 is large, the data retention time will be proportionately decreased. Thus a shorter refresh cycle will be required (equating to more frequent refresh operations) to retain memory data.

A time delay between two successive refresh pulses 305 is proportional to the sum of the electrical charges on cell 410 (the difference in voltage across the transfer gates 430 terminal 433 and terminal 431 divided by the sum of the leakage currents. The time delay is expressed by the following formula:

$$T_d = \frac{\Delta V^*(N1^*Cj + N2^*Ccell)}{N1(Isub + Ijunction) + N2^*Igate + \ldots)}$$

Where: ΔV=|VBL−VSN (VDD or Vtp)|; N1 is the number of transfer gate; and N2 represents the number of capacitors.

Figure 5:
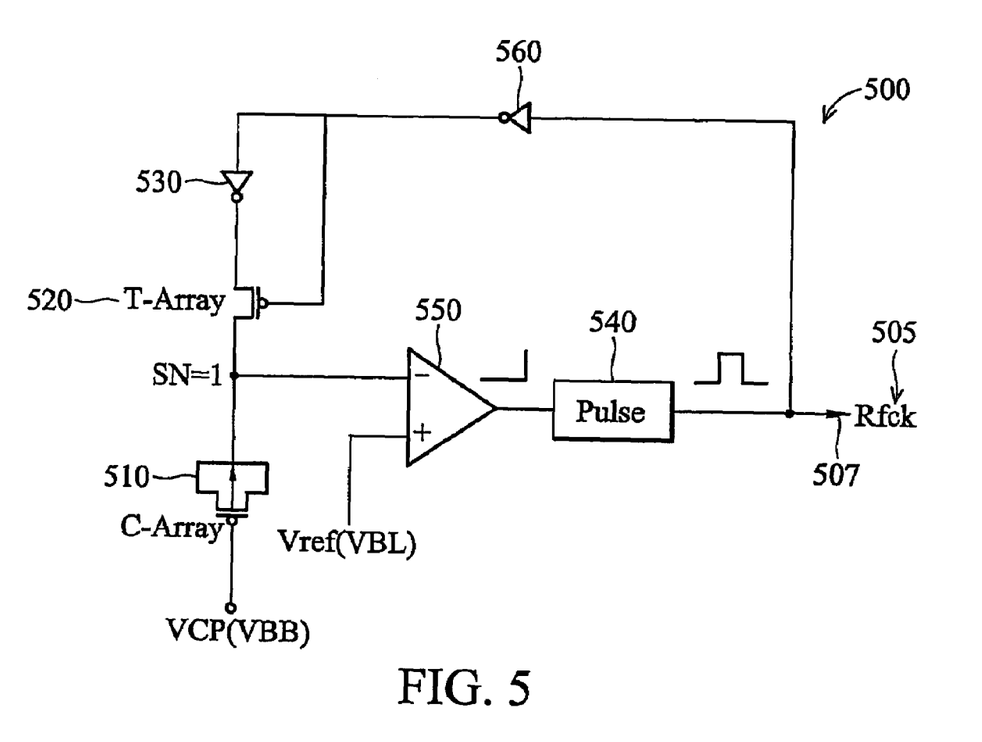
FIG. 5 is a schematic diagram of an alternate embodiment of the invention utilizing a pulse generator to generate a refresh clock.

FIG. 5 is a schematic diagram of an alternate embodiment of the invention utilizing a pulse generator 540 to generate a refresh clock 505. The operation is the same as that describe in FIG. 3 with the exception that an inverter 560 has been added to permit the base of a transfer gate 520 to tie directly to a 507 bus.

Figure 6:
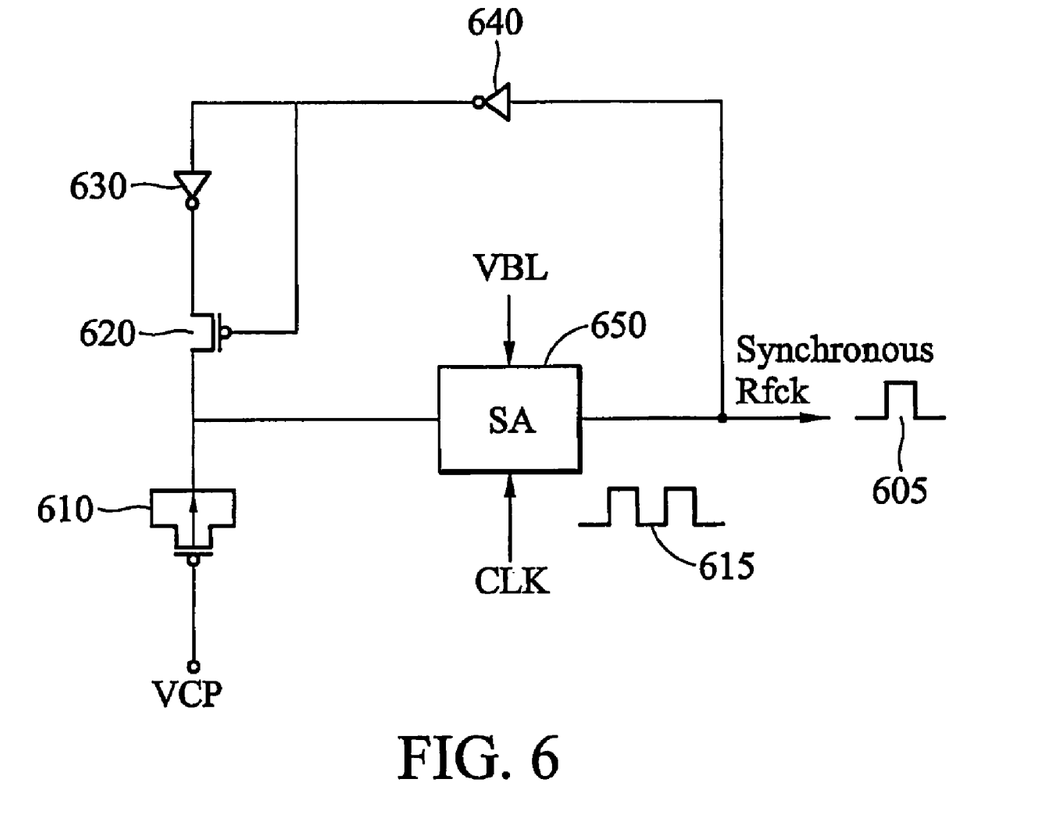
FIG. 6 is a schematic diagram of an alternate embodiment of the invention utilizing a sense amplifier to generate a refresh clock.

FIG. 6 is a schematic diagram of an alternate embodiment of the invention utilizing a sense amplifier means 650 to generate a refresh clock 605. The sense amplifier means 650 functionally replaces the comparator detector means 550 and the pulse forming means 540. A clock 615 formed from a circuit receiving a base clock signal and generating an internal clock signal in synchronization with the base clock signal.

Figure 7A:
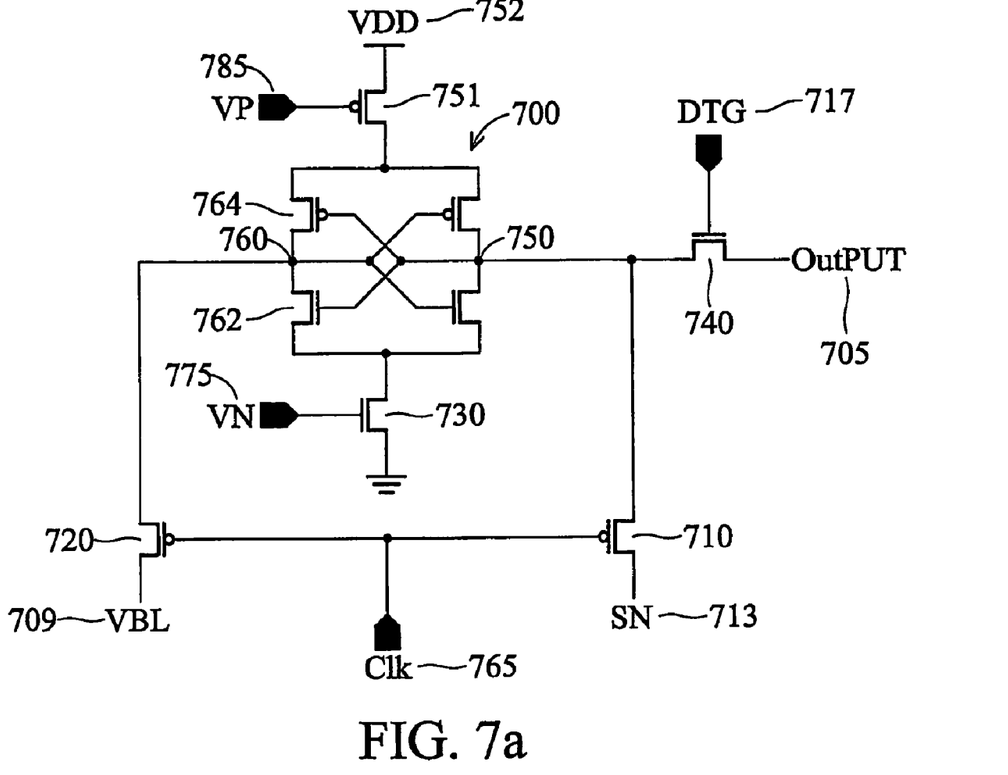
FIG. 7a is a schematic diagram of a sense amplifier used in the generation of refresh clock for an alternate embodiment.

FIG. 7a is one embodiment of FIG. 6 sense amplifier 650 used in the generation of refresh clock 605. Clock 765 is generated from a system clock (unshown) to provide the same function as the clock, which periodically strobes a reference potential VBL 709 and a leakage potential SN 713. The strobe functions as a sampling clock to insure that the DTG 717 is synchronous to the system clock. When the leakage potential SN 713 reaches the reference state potential VBL 709, that is, both the reference potential VBL 709 and a leakage state potential SN driving DTG 717 high, a refresh clock 705 is produced.

Figure 7B:
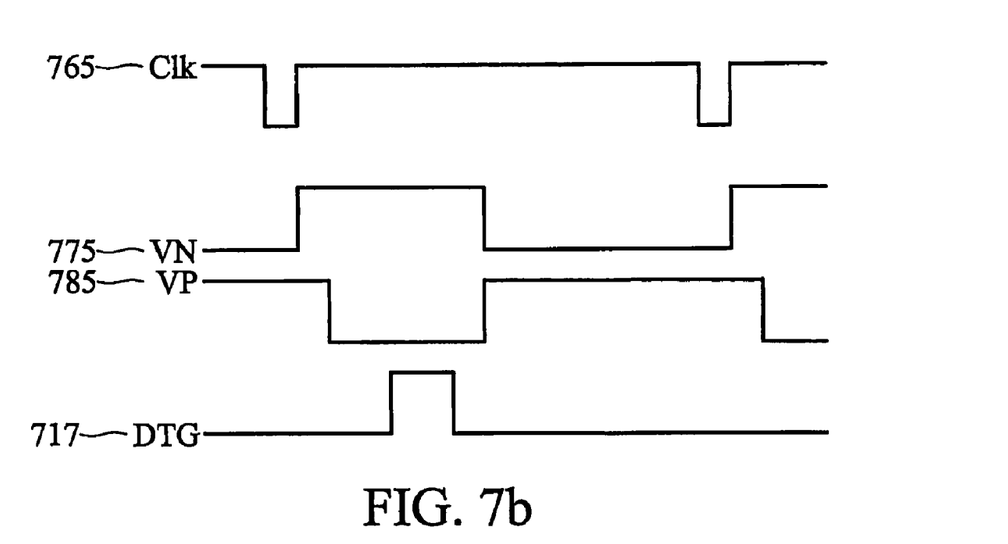
FIG. 7b is a timing diagram of the states required for the sense amplifier in the alternate embodiment to generate a refresh clock.

FIG. 7b is a timing diagram of the states required for the sense amplifier 700 used in the generation of refresh clock 705 in the alternate embodiment shown in FIG. 7a. Signals VP 785, VN 775 and DTG 795 are the basic signals for the sense amplifier 700. These signals are generated from the control circuits indicated in FIG. 1 such as control 120 to achieve the DATA R/W 109 cycles. Because nmos semiconductors are faster than pmos semiconductors, having comparable device size, the first stage of sensing enables an nmos gate 762 to accomplish a preliminary amplification, that is it pulls the lower signal to ground, causing it to turn on the corresponding pmos gate 764, pulling its output to a potential VDD 752. After VN 775 goes high to enable the nmos gate 762 of the sense amplifier 700, it is followed by signal VP 785 transitioning low that pulls pmos gate 751 to VDD 752, thus completing the sensing operation. Signal DTG 717 goes high after the sensing operation and establishes the timing of refresh clock 705 cycle.

Potential VBL 709 is at constant potential constituting a pre-charge level for the bit-lines indicated in FIG. 1, and is often referred to in the art as a bit line reference. Potential SN sweeps in potential from |VTPI to VBL (Vref) as previously indicated in FIG. 3. CLK 765 serves to sample the voltage at SN 713. If the voltage SN 713 is lower than the voltage VBL 709, then the voltage at node 750 will be pulled down to the level of VSS (unshown); and the output 705 will attain a low state. When voltage 713 increases greater than the voltage VBL 709, node 750 will be pulled up to VDD 752, and DTG 717 will generate the refresh clock 705.

Figure 8:
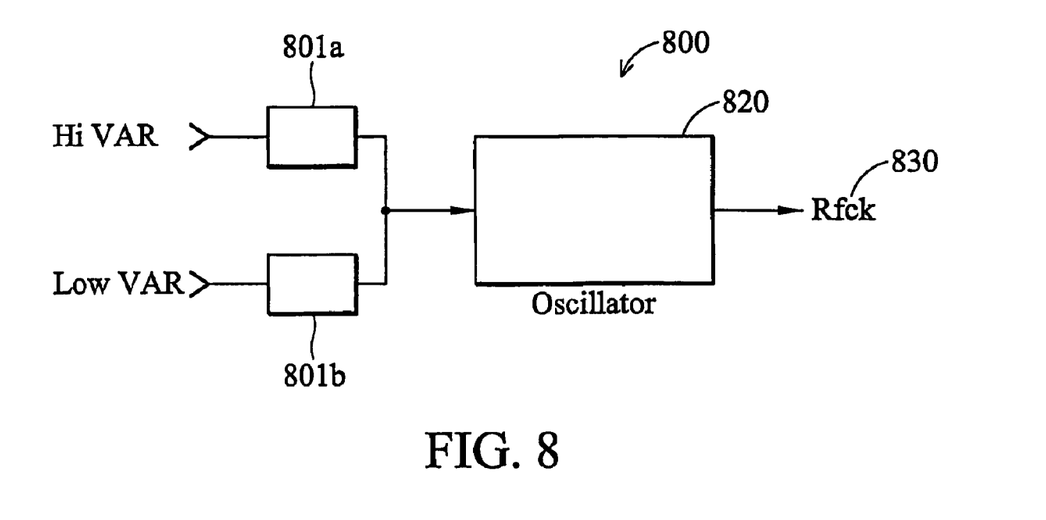
FIG. 8 is a block diagram of an alternate embodiment of the invention utilized to generate a refresh clock.

In an alternate embodiment of the invention, FIG. 8 shows a device 800 utilized to generate a refresh clock 830 that tracks one or more of the influences of process, temperature and voltage variations on the memory cell leakage condition. The frequency of an oscillator means 820 has a frequency determining element proportional to the DRAM 100 system, high and a low analog, of one or more of a process, voltage and temperature condition. The invention contemplates that any oscillator may be utilized provided that its frequency may be made dependant upon the variables associated with influences of process, temperature and voltage variations on the memory cell leakage condition. As for example, if the variable 801a is a state variable representative of relative high temperature, then the frequency of oscillation of oscillator 820 increases and generates a signal that serves to produce a variable refresh clock 830 rate. Correspondingly, if a variable 801b is a state variable representative of relative low temperature, then the frequency of oscillator 820 decreases and generates a signal that serves to produce a variable refresh clock 830 rate.

Figure 9:
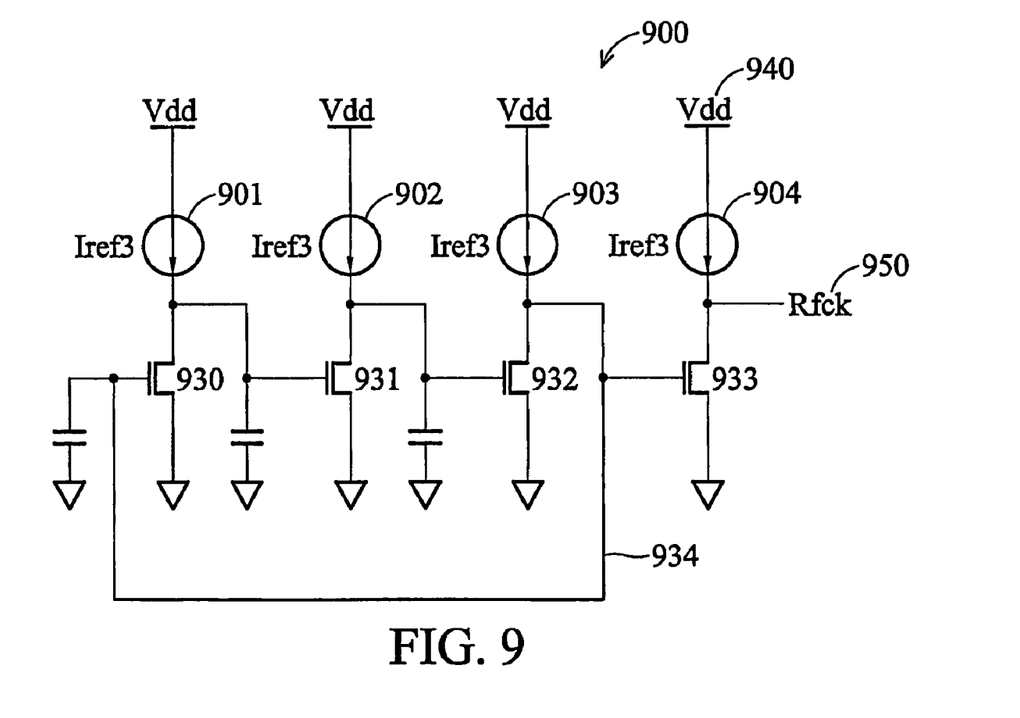
FIG. 9 is a schematic diagram of an alternate embodiment of the invention utilized to generate a refresh clock.

FIG. 9 illustrates a ring oscillator 900, the frequency of which is controlled by a series of state variables, representing process, temperature and voltage DRAM 100 conditions. The ring oscillator 900 chosen as illustrative only, has by way of example, one or more DRAM 100 current leakage rate-dependent current generators Iref3 901–904, that influence the frequency of oscillator 900. Transistors 930–932 represent frequency determining devices, frequencies of which are dependent upon the current flow through the respective devices, such that the oscillator 900 generates a clock frequency 933 that serves to produce a variable refresh clock 950 rate. Generally, the larger the current, the higher the oscillation frequency of oscillator 900.

Figure 10:
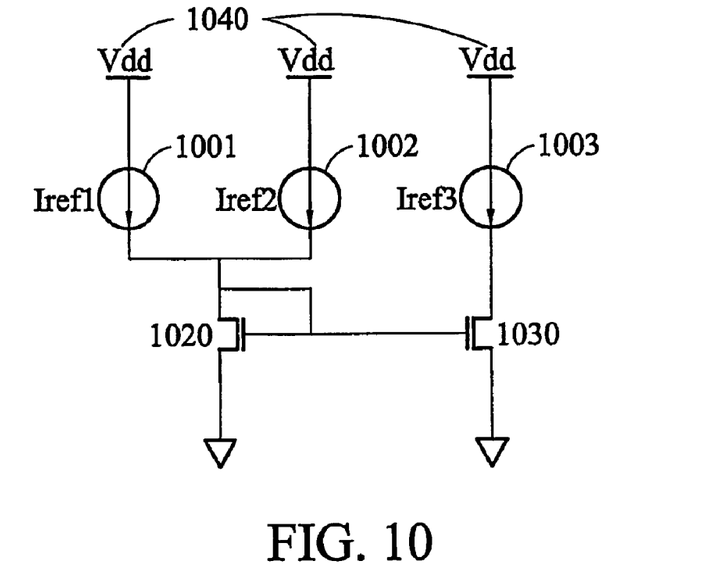
FIG. 10 is a schematic diagram of the circuit to generate a reference current.

FIG. 10 is a schematic circuit diagram illustrating a current source Iref 1003, which corresponds for purpose of analysis to one of the current sources Iref3 901–904 indicated in FIG. 9. The current source Iref 1003 is the sum of an off current source Iref1 1001 responsive to a higher process, temperature and voltage DRAM 100 condition and an off current source Iref2 1002, also responsive to a higher process, temperature and voltage DRAM 100 condition. For purpose of analysis, if the condition were a temperature effect, then the current Iref1 1001 and the current source IRef2 1002 would be responsive to DRAM 100 temperature variations. Using temperature as the variable for exemplary purposes, the operation of Iref1 1001 and Iref 1002 are further described with reference to FIG. 11.

Figure 11:
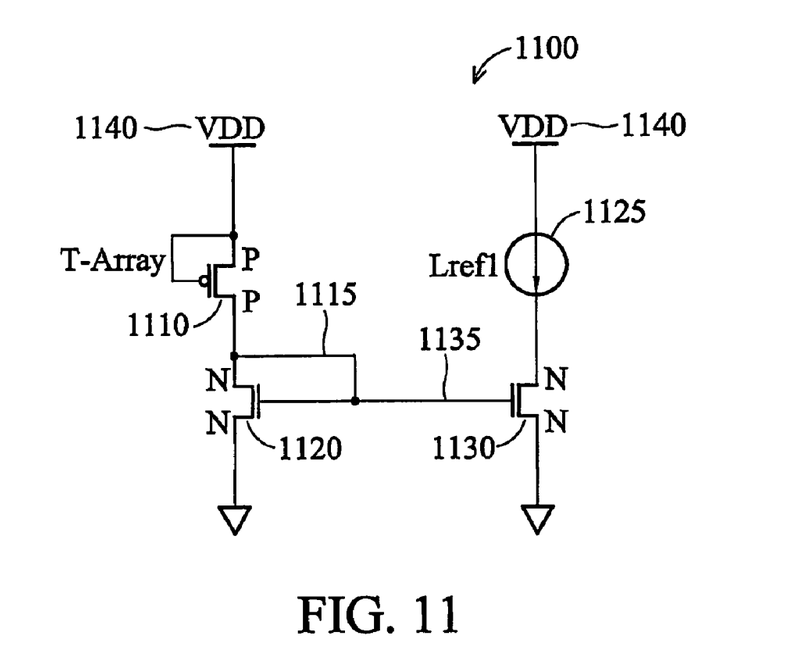
FIG. 11 is a schematic diagram of the circuit to generate a reference current.

In FIG. 11, a circuit 1100 includes a pair of transistors 1120 and 1130, whereby transfer gate 1110 represents a number N of cell transfer gates, through which flows a current statistically representative of leakage currents through the DRAM 100 at relatively high temperature conditions, because the transfer gates 1110 forming the array are constructed from the cell technology utilized in the manufacturing of the DRAM 100. Therefore, the transfer gates 1110 are subject to the same process, voltage and temperature variations and thereby any effect upon the DRAM 100 memory elements are reflected in the transfer gates 1110 to thereby track the variations related to DRAM 100 memory array 116 cells. The n-channel MOS transistor 1130 is connected in series between the drain voltage VDD 140 and ground. A node 1135 is connected to the gate of the transistor 1130. The p-channel MOS transistor 1110 and the n-channel MOS transistor 1120 are connected in series between VDD 140 and the ground. A node 1115 located between the transistors 1110 and 1120 is connected to the gate of the transistor 1120. The gate of the transistor is connected to the node 1135. The transistors 1110 and 1120 form a current mirror circuit relative to a Iref1 1125. Therefore the current flowing in the transfer gate array 1110 is reflected in the current source Iref1 1125. The average over the large number of leakage current sources produced by the multiplicity of transfer gates 1110 as configured in the current mirror circuit, form a statistically stable current generator Iref1 1125. Essentially, the circuit as illustrated in FIG. 11 uses currents and junction leakage currents as a current mirror source to control the current flowing in Iref1 1125.

Figure 12A:
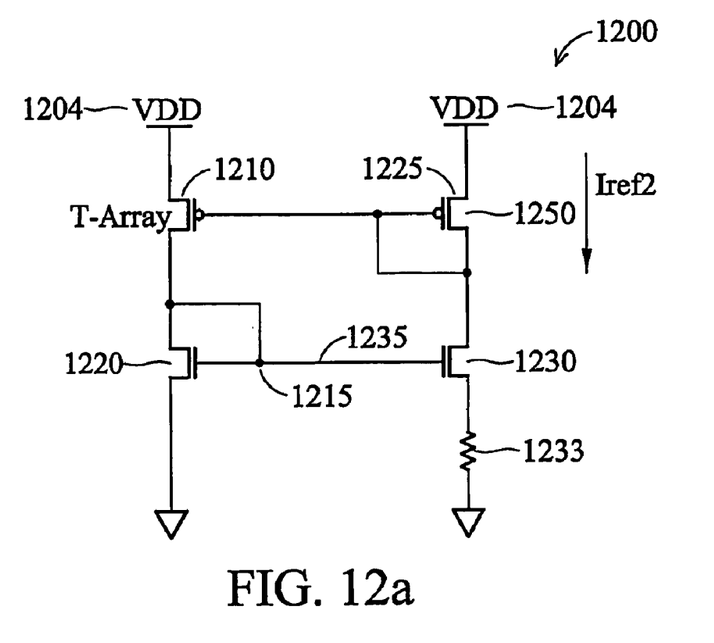
FIG. 12*a* is a schematic diagram of the circuit to generate a reference current.

FIG. 12a illustrates a circuit 1200 having frequency determining elements proportional to a DRAM 100 system, low analog, of one or more of a process, voltage and temperature condition. Transfer gate 1210 represents a number N of cell transfer gates, through which flows a current statistically representative of leakage currents through the DRAM 100 at relatively high temperature conditions, because the transfer gates 1210, forming the array, are constructed from the cell technology utilized in the manufacturing of the DRAM 100. Therefore, the transfer gates 1210 are subject to the same process, voltage and temperature variations and thereby any effect upon the DRAM memory elements are reflected in the transfer gates 1210 to thereby track the variations related to DRAM 100 memory array 116 cells. The n-channel MOS transistor 1230 is connected in series between the drain voltage VDD 1240 and ground. A node 1235 is connected to the gate of the transistor 1230. The p-channel MOS transistor 1210 and the n-channel MOS transistor 1220 are connected in series between VDD 1240 and the ground. A node 1215 located between the transistors 1210 and 1220 is connected to the gate of the transistor 1220. The gate of the transistor is connected to the node 1235. Transistor 1230 connects to resistor 1233, which serves to lower the temperature effect of any off current source, since as the temperature the resistor 1233 increases, due to a positive temperature coefficient, lowering the current flow through transistor 1230. The transistors 1210 and 1220 form a current mirror circuit relative to a current Iref2 1225 flowing through transistor 1250. Therefore the current flowing in the transfer gate 1210 is reflected in the current source Iref2 1225. The average over the large number of leakage current sources produced by the multiplicity of transfer gates 1210 as configured in the current mirror circuit, form a statistically stable current generator Iref2 1225. Essentially, the circuit as illustrated in FIG. 12 uses currents and junction leakage currents as a current mirror source to control the current flowing in Iref2 1225.

Figure 12B:
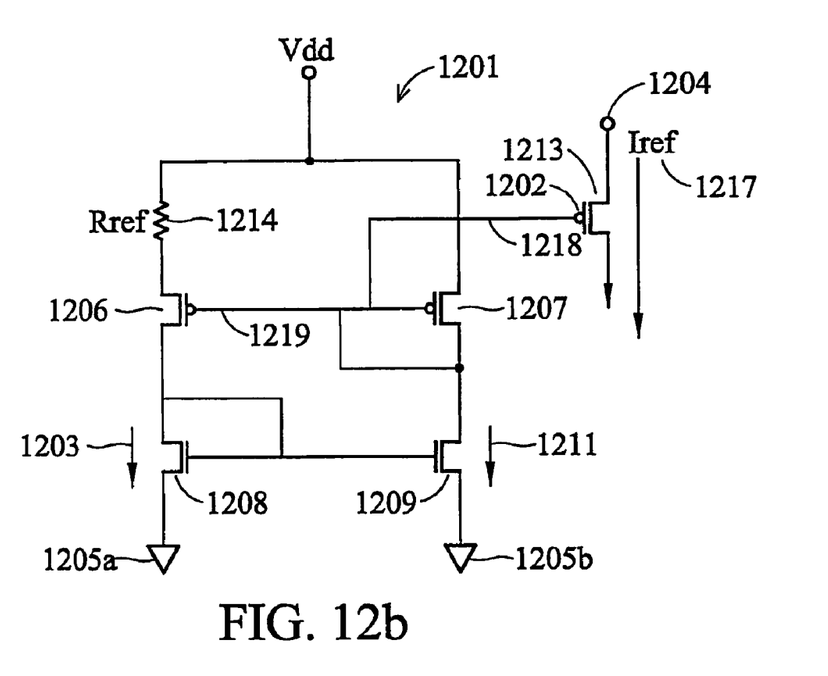
FIG. 12*b* is a schematic diagram of the circuit to generate a reference current.

In yet another embodiment of a circuit that generates a constant current, utilized as a constant current in a refresh circuit such as FIG. 3b current source 304, FIG. 12b, discloses a bias-independent current source 1201, that provides for a low temperature effect current source 1217. The current source has the effect of depressing the high temperature dependency of the off current source.

The circuits depicted in FIG. 12a and FIG. 12b are functionally similar. As shown in FIG. 12b, the potential VDD 1204 is connected to the drain of gate 1213. VSS 1205a and VSS 1205b are coupled to the sources of gates 1208 and 1209, respectively. Each MOS (1206, 1207, 1208 and 1209) in FIG. 12b are biased so as to produce saturation. PMOS 1213 mirrors a reference current I ref 1217 by having the same gate to source bias VGS 1215 as PMOS 1207. VSS 1205a does vary with temperature. However, the threshold voltage of PMOS 1213 does change with changes in temperature. The reference current is determined by PMOS 1206, PMOS 1207 and Rref 1214. The governing equations of the circuit are Vss 1205a+VGS 1219+Iref 1217*Rref=VDD=VDD 1205a+VGS 1218, and IDS 1203=IDS_1211 due to matched transistors (the same channel width and length) PMOS 1208 and PMOS 1209.

Then Iref 1217 can be derived as:

$$Iref = \left(VGS\_1218 - VGS\_1219/Rref = \frac{2}{Rref^2 \times \beta\_1206}(K-1)^2, \right.$$

where $\beta\_1206 \propto \mu C_{ox} W\_1206/L\_1206$, and $K$ is $\sqrt{\frac{\beta\_1206}{\beta\_1207}}$ Therefore, Iref 1217 is a supply voltage, such as VDD, independent current source and proportional to the square of 1/Rref 1214. When the current source Iref 1214 has been established, the gate at node 1202 will track the supply voltage VDD. The temperature coefficient of Iref 1217 is relatively small and may only be 1~10% current increase at 100° C. of temperature variation due to relatively small temperature coefficient of Rref 1214. As for Ioff (pure off current source described in FIG. 3), it is subject to a much greater temperature coefficient and it will increase more than 10 times, while temperature correspondingly increases by 100° C. The current source in FIG. 12 is therefore supply voltage VDD independent and insensitive to temperature variation. Briefly, FIG. 12a and FIG. 12b are the optional current sources with low temperature effect that alleviates the aggressive temperature effect of pure off current source.

The invention herein disclosed includes a method of adjusting a dynamic DRAM 100 refresh rate based on cell leakage monitoring. From FIG. 3 the method is seen as comprising dissipating electrical charges from the memory cells 310 having operating characteristics drawn from memory cells utilized in the semiconductor memory; dissipating electrical charges and providing a current 347 proportional to the leakage of charge from at least one memory cell 310 one or more transfer gates 320, whereby each transfer gate 320 is associated with one memory cell 312, the pair of which provides a current proportional to a leakage of charge from a corresponding DRAM 00 memory cell 116; detecting the leakage current in a switching means forming a pulse utilizing a pulse forming means 350 responsive to a change in state of the switching means such that it generates a refresh pulse 305 that serves to produce a continuously variable refresh clock 305 rate.

In an alternate embodiment, the invention comprises a method of adjusting a dynamic DRAM 100 refresh rate based on cell leakage monitoring, including: generating a frequency proportional to a DRAM 100, high and a low analog, of one or more of a process, voltage and temperature condition; tracking the transfer current representative of a leakage rate of at least one of the monitor memory cells 1200 or memory cell 1100; and adjusting a refresh rate based on the leakage rate of the monitor memory cell 1200.

Figure 13:
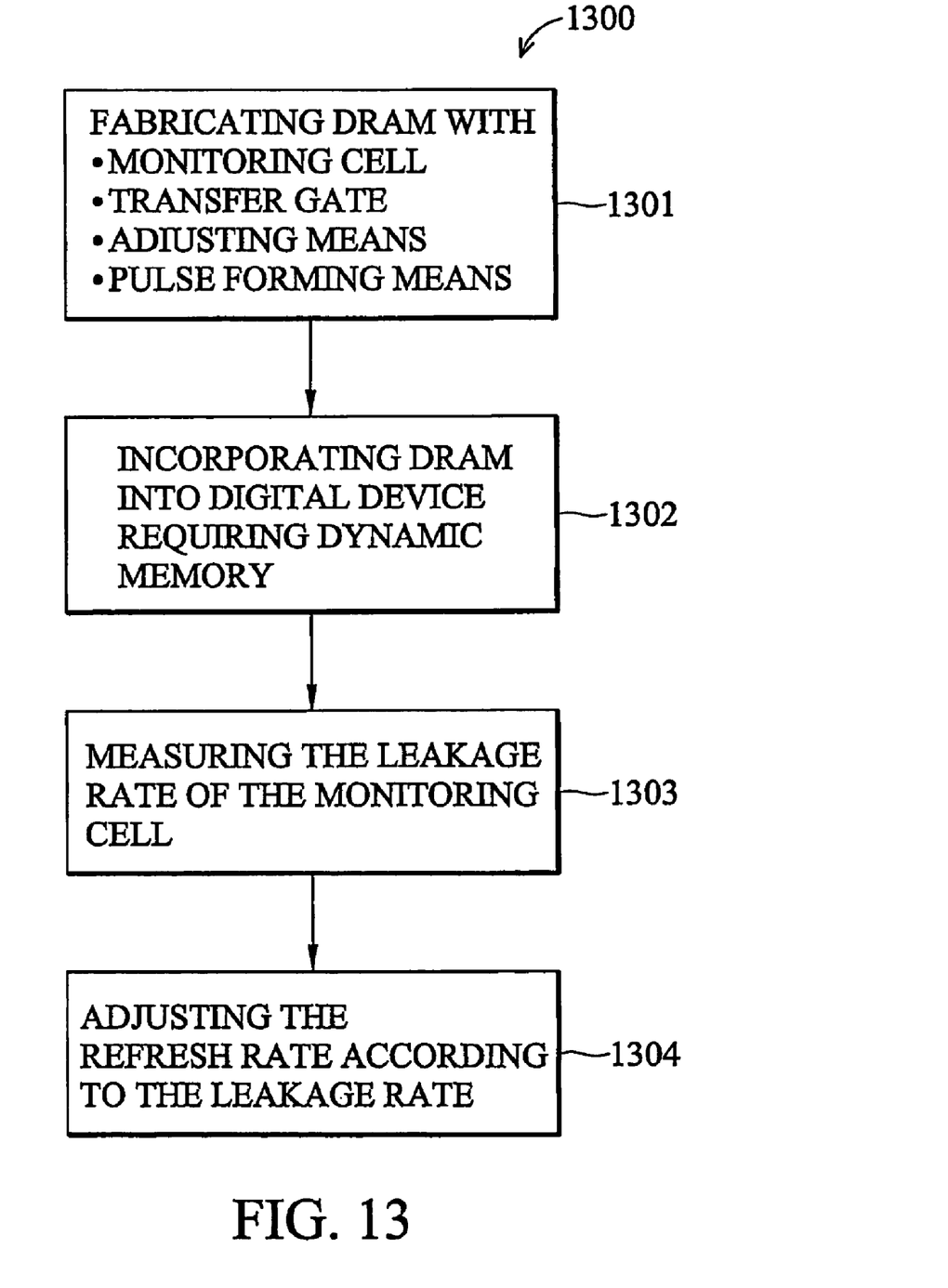
FIG. 13 is a method of fabricating the invention.

The invention herein disclosed also includes the method of fabricating DRAM 100 refresh rate device and then measuring the refresh the refresh rate based on cell leakage monitoring. As shown in FIG. 13, The steps include fabricating 1301 a DRAM 100 having one or more monitor memory cells; incorporating the fabricated DRAM 100 into a digital device 1302 requiring said DRAM 100 type memory; measuring 1303 the leakage rate produced by at least one of the cells and transfer gate pair; and adjusting 1304 a refresh rate based on the leakage rate of the cells and transfer gate pair; wherein the fabrication includes the steps of: providing at least one memory cell 310 and at least one transfer gate 333 to charge said cell; and providing an adjusting means 340 that tracks the leakage of charge; and providing a pulse forming means 350 that generates a pulse in response to a measured leakage rate that serves to produce a continuously variable refresh clock 305 rate.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims.

What is claimed is:

1. A semiconductor memory having a self refresh mode comprising:

a potential generation means for supplying a reference voltage;

one or more means for storing a charge;

one or more transfer gates, whereby each transfer gate is associated with one or more means for storing a charge that provides a current proportional to a leakage of charge from the semiconductor memory;

a switching means responsive to the leakage of charge and the reference voltage; and a pulse forming means responsive to a change in state of the switching means, such that said pulse forming means generates a pulse that serves to produce a refresh clock.

2. The semiconductor memory in claim 1, wherein the one or more means for storing have operating characteristics drawn from memory cells utilized in the semiconductor memory.

3. The semiconductor memory in claim 1, wherein the one or more transfer gates have operating characteristics drawn from transfer gates utilized in the semiconductor memory.

4. The semiconductor memory in claim 1, wherein the switching means compares the reference voltage to a voltage potential proportional to the leakage of charge.

5. The semiconductor memory in claim 1, wherein the switching means compares logic levels between a reference logic and a logic level representing a leakage current.

6. The semiconductor memory in claim 1, wherein the means for storing charge is a capacitor memory cell.

7. The semiconductor memory in claim 1, wherein the pulse forming means generates a pulse having a continuously variable pulse repetition rate.

8. The semiconductor memory in claim 7, wherein the continuously variable pulse repetition rate is proportional to the variations in temperature of the semiconductor memory.

9. The semiconductor memory in claim 7, wherein the continuously variable pulse repetition rate is proportional to the voltage fluctuations of the semiconductor memory.

10. The semiconductor memory in claim 7, wherein the continuously variable pulse repetition rate is proportional to the process variations of the semiconductor memory.

11. The semiconductor memory in claim 1, wherein the one or more means for storing charge includes a separate reference potential, to which the means for storing are biased.

12. A method of adjusting a semiconductor memory refresh rate based on cell leakage monitoring, comprising:

generating a frequency proportional to variatons associated with influence of at least one process, a a voltage and a temperature condition of the semiconductor memory;

tracking a leakage rate of one or more monitor memory cells; and adjusting the refresh rate based on the leakage rate of one or more monitor memory cells.

13. A method of adjusting a dynamic semiconductor memory refresh rate based on a memory cell leakage of charge rate, comprising:

dissipating electrical charges from one or more transfer gates, each associated with one or more memory cells and providing a current proportional to a leakage of charge from at least one memory cell;

detecting means responsive to the leakage of charge being proportional to a referenced voltage;

forming a pulse means responsive to a change in state of the detecting means, such that the pulse forming means generates a pulse that serves to produce a continuously variable refresh rate.

14. A method of adjusting a semiconductor memory refresh rate based on cell charge leakage rates, comprising:

fabricating the semiconductor memory having one or more monitor memory cells;

incorporating the semiconductor memory into a digital device;

measuring the leakage rate of at least one of the monitor memory cells; and adjusting the refresh rate based upon the charge leakage rate of the monitor memory cell;

wherein the fabrication includes the steps of:

providing at least one monitor memory cell and at least one transfer gate to charge said cell;

providing an adjusting means that tracks the leakage of charge; and providing a pulse forming means that generates a pulse in response to a measured leakage rate that serves to produce a continuously variable refresh rate.

15. The method of adjusting a semiconductor memory refresh rate in claim 14, wherein the adjusting means is comprised of a switching means responsive to a reference means and a potential proportional to leakage of charge.

16. A semiconductor memory device having a self refresh mode comprising:

a reference voltage;

one or more memory cells having operating characteristics drawn from a set memory cells utilized in the semiconductor memory;

one or more transfer gates, each associated with one of the one or more memory cell, having operating characteristics drawn from transfer gates utilized in the semiconductor memory to provide a current proportional to a leakage of charge from one memory cell;

a comparator means responsive to a voltage across the one of the one or more memory cell and a reference voltage; and a pulse forming means responsive to a change in state of the comparator means such that it generates a pulse;

said pulse that serves to produce a refresh rate and further provides an input to a switching gate to reset a monitoring leakage cycle.

17. The semiconductor memory device in claim 16, wherein the refresh rate is continuously variable.

18. The semiconductor memory device in claim 16, wherein the refresh rate is proportional to the variations in temperature of the semiconductor memory.

19. The semiconductor memory device in claim 16, wherein the refresh rate is proportional to the voltage fluctuations of the semiconductor memory.

20. The semiconductor memory device in claim 16, wherein the refresh rate is proportional to the process variations of the semiconductor memory.

21. The semiconductor memory device in claim 16, wherein the one or more one or more memory cells includes a separate reference potential to which the cells are attached.

* * * * *

UNITED STATES PATENT AND TRADEMARK OFFICE
CERTIFICATE OF CORRECTION

| | | |
|---|---|---|
| PATENT NO. | : 7,177,220 B2 | Page 1 of 2 |
| APPLICATION NO. | : 10/841264 | |
| DATED | : February 13, 2007 | |
| INVENTOR(S) | : Chung-Cheng Chou and Chien-Hua Chuang | |

It is certified that error appears in the above-identified patent and that said Letters Patent is hereby corrected as shown below:

Column 3, line 46, after "RAS" (first occurrence), insert --106. This latches the row address 112 and activates the row, transferring the data in the row to--.

Column 4, line 43, delete "FIG" and insert therefore -- figure --.

Column 4, line 58, after "system's" insert -- applications. The invention herein described eliminates the requirement for the conventional --.

Column 4, line 61, after "of" insert -- one to ten nanoseconds. The ellipsis 227 represents a chain of inverters. The propagation delay --.

Column 4, line 63, delete "(10-2" and insert therefore -- (10-12 --.

Column 5, line 2, after "capacitor" insert -- pairs. The invention herein described eliminates the requirement for the conventional refresh --.

Column 5, line 6, after "utilizing" insert -- hundreds of transfer gates or lumped in tens of larger devices. As by way of example, one --.

Column 6, line 17, delete "$\mu$or" and insert therefore -- $\mu$ or --.

Column 7, line 11, after "generator" insert -- 350 producing the output pulse 305. The pulse 305 typically measures 1ns positive, which starts --.

Column 8, line 35, after "SN" insert -- 713 are coincident, a state 750 switches high and upon the occurrence of a voltage potential --.

Column 8, line 58, after "SN" insert -- 713 denotes a storage node and serves the same function as node 311 of FIG. 3. It varies or --.

UNITED STATES PATENT AND TRADEMARK OFFICE
CERTIFICATE OF CORRECTION

PATENT NO. : 7,177,220 B2
APPLICATION NO. : 10/841264
DATED : February 13, 2007
INVENTOR(S) : Chung-Cheng Chou and Chien-Hua Chuang It is certified that error appears in the above-identified patent and that said Letters Patent is hereby corrected as shown below:

Column 11, line 44, after "means" insert -- 340 responsive to the leakage current being proportionally equal to the referenced voltage 306; --.

Signed and Sealed this

Twenty-eighth Day of August, 2007

JON W. DUDAS
*Director of the United States Patent and Trademark Office*